United States Patent
Terashima

(10) Patent No.: US 7,723,802 B2
(45) Date of Patent: May 25, 2010

(54) SEMICONDUCTOR DEVICE

(75) Inventor: Tomohide Terashima, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 333 days.

(21) Appl. No.: 11/048,295

(22) Filed: Feb. 2, 2005

(65) Prior Publication Data

US 2006/0043475 A1 Mar. 2, 2006

(30) Foreign Application Priority Data

Aug. 27, 2004 (JP) ............................. 2004-248214

(51) Int. Cl.
*H01L 29/735* (2006.01)
(52) U.S. Cl. .................. 257/378; 257/E29.197
(58) Field of Classification Search ................. 257/378, 257/370, 526, 552, 565, E29.197, E29.198
See application file for complete search history.

(56) References Cited

U.S. PATENT DOCUMENTS

| | | | | |
|---|---|---|---|---|
| 5,279,977 A | * | 1/1994 | Kida et al. | 438/155 |
| 5,436,486 A | * | 7/1995 | Fujishima et al. | 257/378 |
| 5,485,023 A | * | 1/1996 | Sumida | 257/139 |
| 5,977,569 A | * | 11/1999 | Li | 257/119 |
| 2002/0053717 A1 | | 5/2002 | Sumida | |
| 2005/0072990 A1 | | 4/2005 | Terashima | |

FOREIGN PATENT DOCUMENTS

| | | |
|---|---|---|
| DE | 196 14 522 C2 | 5/1997 |
| GB | 2 286 484 A | 8/1995 |
| JP | 05-129598 | 5/1993 |
| JP | H06-132525 | 5/1994 |
| JP | 09-82961 | 3/1997 |
| JP | H09-129762 | 5/1997 |
| JP | 2005-109394 | 4/2005 |

OTHER PUBLICATIONS

German Office Action dated Apr. 5, 2007 in corresponding German Patent Application No. 10 2005 031 139.3-33 and its English translation.
Japanese Office Action dated Oct. 6, 2009 from corresponding Japanese Patent Application No. 2004-248214 and its English translation.

* cited by examiner

*Primary Examiner*—Lynne A Gurley
*Assistant Examiner*—Colleen A Matthews
(74) *Attorney, Agent, or Firm*—Buchanan Ingersoll & Rooney PC

(57) ABSTRACT

A semiconductor device includes a P diffusion region formed in the surface of an $N^-$ epitaxial layer apart from other P diffusion regions; an $N^+$ diffusion region formed in the surface of the P diffusion region so as to be surrounded by the P diffusion region; a second collector electrode provided on the $N^+$ diffusion region and connected to a first collector electrode; and an electrode provided on and extending through the P diffusion region and the $N^-$ epitaxial layer to form a conducting path from the $N^-$ epitaxial layer to the P diffusion region. This semiconductor device can improve both the operation and the reverse conducting capability of an IGBT.

43 Claims, 6 Drawing Sheets

SEMICONDUCTOR DEVICE

BACKGROUND OF THE INVENTION

1. Field of the Invention

The present invention relates to a semiconductor device such as an integrated gate bipolar transistor (IGBT) and an integrated circuit (IC) with a built-in IGBT.

2. Description of the Background Art

Generally, the equivalent circuit of a collector-shorted IGBT is structured such that the base and emitter of a PNP transistor, between which the drain and source of an N-channel MOSFET are connected, are short-circuited via a resistance (first conventional example).

In order to turn on the IGBT of this kind, when the collector of the IGBT (the emitter of the PNP transistor) is at a higher potential than the emitter of the IGBT (the source of the N-channel MOSFET), a predetermined positive voltage is applied to the gate of the IGBT (the gate of the N-channel MOSFET). Thereby, the N-channel MOSFET is turned on, whereby electrons are injected from the emitter of the IGBT through the N-channel MOSFET into the base of the PNP transistor, and holes are injected from the collector of the IGBT through the emitter of the PNP transistor into the base of the PNP transistor. This electron and hole injection causes conductivity modulation of the PNP transistor and reduces the turn-on voltage of the PNP transistor, thereby turning on the PNP transistor.

On the other hand, in order to turn off the IGBT of this kind, the application of a predetermined positive voltage to the gate of the IGBT is terminated. This stops the electron and hole injection into the PNP transistor, thereby decreasing electron and hole densities in the PNP transistor and increasing the turn-on voltage of the PNP transistor. Accordingly, the PNP transistor is turned off.

When the emitter of the IGBT is at a higher potential than the collector of the IGBT, the IGBT of this kind conducts current from its emitter to collector through a parasitic diode in the N-channel MOSFET and through the resistance between the base and emitter of the PNP transistor (reverse conducting capability). This reverse conducting capability is essential when the IGBT is adopted as an inductance load.

In the case where an IGBT with no reverse conducting capability (i.e., non-collector-shorted IGBT) is adopted as an inductance load, an external diode needs to be connected in reverse parallel between the collector and emitter of the IGBT (second conventional example).

Such conventional examples can be found in conventional art, for example in Japanese Patent Application Laid-open No. 9-82961 (1997).

The first conventional example given above has the disadvantage that a higher value of the resistance between the base and emitter of the PNP transistor results in a higher conducting resistance during reverse conduction and thus inhibits the reverse conducting capability.

On the other hand, a lower value of the resistance, during turn-on of the IGBT, disadvantageously causes both electrons from the emitter side of the IGBT and holes from the collector side of the IGBT to flow into the resistance without flowing into the base of the PNP transistor. This makes the electron and hole injection into the PNP transistor difficult and slows down the drop in the turn-on voltage of the PNP transistor, thereby delaying the turning on of the IGBT.

On the contrary, a lower value of the resistance, during turn-off of the IGBT, advantageously causes electrons and holes, which are accumulated in the base of the PNP transistor, to be emitted more quickly from the base of the PNP transistor through the resistance. This results in a rapid drop in the turn-on voltage of the PNP transistor, thereby speeding up the turning off of the IGBT.

The second conventional example given above has a disadvantage of higher cost because it requires an external diode whose breakdown voltage and operating current need to be equivalent to those of the IGBT and thus which is about the same size as the IGBT.

SUMMARY OF THE INVENTION

An object of the present invention is to provide a semiconductor device which can simultaneously improve the operation and the reverse conducting capability of an IGBT.

According to the present invention, a semiconductor device includes a semiconductor substrate of a first conductivity type; a semiconductor layer of a second conductivity type; first and second semiconductor regions of the first conductivity type; a third semiconductor region of the second conductivity type; a first gate electrode; a first collector electrode; an emitter electrode; a fourth semiconductor region of the first conductivity type; a fifth semiconductor region of the second conductivity type; a second collector electrode; and an electrode. The semiconductor layer is formed on one main surface of the semiconductor substrate. The first semiconductor region is formed in a surface of the semiconductor layer and connected to the semiconductor substrate through a semiconductor region of the first conductivity type. The second semiconductor region is formed in the surface of the semiconductor layer apart from the first semiconductor region. The third semiconductor region is formed in a surface of the first semiconductor region so as to be surrounded by the first semiconductor region. The first gate electrode is provided on a surface portion of the first semiconductor region which is sandwiched between the third semiconductor region and the semiconductor layer, with a first gate insulating film in between. The first collector electrode is provided on the second semiconductor region. The emitter electrode is provided on and extends through the first and third semiconductor regions. The fourth semiconductor region is formed in the surface of the semiconductor layer apart from the first and second semiconductor regions. The fifth semiconductor region is formed in a surface of the fourth semiconductor region so as to be surrounded by the fourth semiconductor region. The second collector electrode is provided on the fifth semiconductor region and connected to the first collector electrode. The electrode is provided on and extends through the fourth semiconductor region and the semiconductor layer to form a conducting path from the semiconductor layer to the fourth semiconductor region.

The fourth semiconductor region is formed in the surface of the semiconductor layer; the fifth semiconductor region is formed in the surface of the fourth semiconductor region so as to be surrounded by the fourth semiconductor region; and the second collector electrode connected to the first collector electrode is provided on the fifth semiconductor region. Thus, a diode consisting of the fourth and fifth semiconductor regions can prevent electrons, which are injected from the emitter electrode side into the semiconductor layer during turn-on of the semiconductor device, from outflowing from the semiconductor layer into the second collector electrode. Correspondingly, more electrons and holes can be accumulated quickly in the semiconductor layer, which contributes to the conductivity modulation of the semiconductor layer and allows the quick turning on of the semiconductor device.

Further, since the fourth semiconductor region is formed in the surface of the semiconductor layer, and the fifth semiconductor region is formed in the surface of the fourth semiconductor region so as to be surrounded by the fourth semiconductor region, a parasitic thyristor consisting of those fourth and fifth semiconductor regions, the semiconductor layer, and the semiconductor substrate can be formed on a reverse conducting path. Thus, by utilizing a low conducting resistance during the on-state of the parasitic thyristor, the semiconductor device can achieve a reverse conducting capability with low reverse conducting resistance.

Furthermore, since the electrode is provided on and extends through the fourth semiconductor region and the semiconductor layer to form a conducting path from the semiconductor layer to the fourth semiconductor region, the passage of current from the semiconductor layer to the fourth semiconductor region can be ensured during reverse conduction of the semiconductor device. This stabilizes the turning on of the parasitic thyristor.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
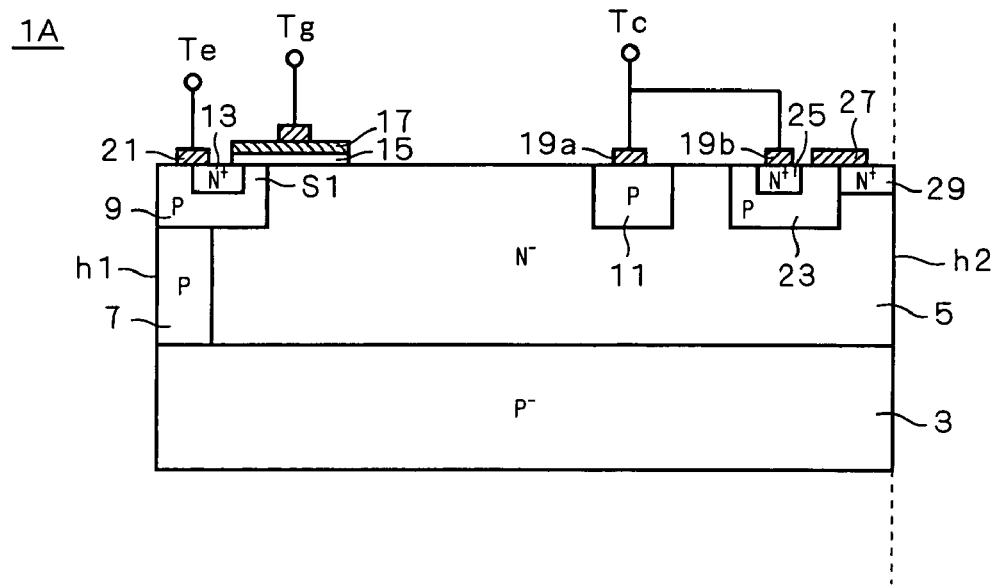
FIG. 1 is a cross-sectional view of a semiconductor device according to a first preferred embodiment.

A semiconductor device 1A according to this preferred embodiment is a lateral collector-shorted IGBT. It includes, as shown in FIG. 1, a $P^-$ substrate 3 (semiconductor substrate of a first conductivity type); an $N^-$ epitaxial layer 5 (semiconductor layer of a second conductivity type) formed on one main surface of the $P^+$ substrate 3; a P diffusion region 9 (first semiconductor region of the first conductivity type) formed in the surface of the $N^-$ epitaxial layer 5 and connected to the $P^+$ substrate 3 through a P diffusion region 7 (semiconductor region of the first conductivity type); a P diffusion region 11 (second semiconductor region of the first conductivity type) formed in the surface of the $N^-$ epitaxial layer 5 apart from the P diffusion region 9; an $N^+$ diffusion region 13 (third semiconductor region of the second conductivity type) formed in the surface of the P diffusion region 9 so as to be surrounded by the P diffusion region 9; a first gate electrode 17 provided on a surface portion of the P diffusion region 9 which is sandwiched between the $N^+$ diffusion region 13 and the $N^-$ epitaxial layer 5, with a first gate insulating film 15 in between; a first collector electrode 19*a* provided on the P diffusion region 11; and an emitter electrode 21 provided on and extending through the P diffusion region 9 and the $N^+$ diffusion region 13. In addition to this fundamental structure, the semiconductor device 1A further includes a P diffusion region 23 (fourth semiconductor region of the first conductivity type) formed in the surface of the $N^-$ epitaxial layer 5 apart from the P diffusion regions 9 and 11; an $N^+$ diffusion region 25 (fifth semiconductor region of the second conductivity type) formed in the surface of the P diffusion region 23 so as to be surrounded by the P diffusion region 23; a second collector electrode 19*b* provided on the $N^+$ diffusion region 25 and connected to the first collector electrode 19*a*; and an electrode 27 provided on and extending through the P diffusion region 23 and the $N^-$ epitaxial layer 5 to form a conducting path from the $N^-$ epitaxial layer 5 to the P diffusion region 23. In this preferred embodiment, the electrode 27 is provided on the $N^-$ epitaxial layer 5 with an $N^+$ diffusion region 29 formed in the surface of the $N^-$ epitaxial layer 5 in between, so as to form an ohmic contact with the $N^-$ epitaxial layer 5.

The first gate electrode 17 is connected to a gate terminal Tg, the first and second collector electrodes 19*a* and 19*b* in common to a collector terminal Tc, and the emitter electrode 21 to an emitter terminal Te.

The P diffusion regions 7 and 9 are located on one end h1 of the $N^-$ epitaxial layer 5, the P diffusion region 11 is located in about a central portion of the $N^-$ epitaxial layer 5, and the P diffusion region 23 is located on the other end h2 of the $N^-$ epitaxial layer 5. The $N^+$ diffusion region 29 is located adjacent to the side of the P diffusion region 23 on the other end h2 side of the $N^-$ epitaxial layer 5.

The semiconductor device 1A, as a whole, is of a circular structure, which can be obtained by rotation of the cross section of FIG. 1 about the other end h2 of the $N^-$ epitaxial layer 5.

Figure 2:
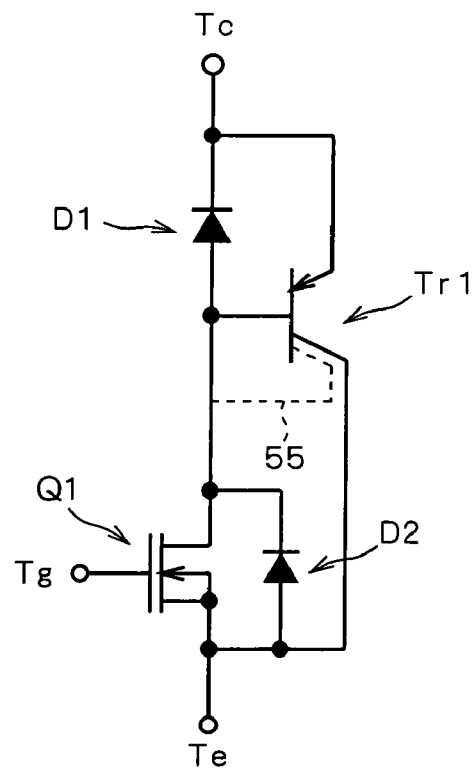
FIG. 2 is an equivalent circuit diagram of the semiconductor device 1*n* FIG. 1.

The equivalent circuit of the semiconductor device 1A is, as shown in FIG. 2, such that a PNP transistor Tr1 is inserted and connected between the collector terminal Tc and the emitter terminal Te; a diode D1 is connected in reverse parallel between the base and emitter of the PNP transistor Tr1; the drain and source of an N-channel MOSFET Q1 are connected between the base and collector of the PNP transistor Tr1. A diode D2 is a parasitic diode in the N-channel MOSFET Q1.

The PNP transistor Tr1, when viewed in FIG. 1, has its emitter formed of the P diffusion region 11, its base formed of the $N^-$ epitaxial layer 5, and its collector formed of the $P^+$ substrate 3 and the P diffusion regions 7 and 9. The diode D1, when viewed in FIG. 1, has its cathode formed of the $N^+$ diffusion region 25 and its anode formed of the P diffusion region 23. The N-channel MOSFET Q1, when viewed in FIG. 1, has its well formed of the P diffusion regions 7 and 9 and the $P^+$ substrate 3, its drain formed of the $N^-$ epitaxial layer 5, its source formed of the $N^+$ diffusion region 13, its gate insulating film formed of the first gate insulating film 15, and its gate electrode formed of the first gate electrode 17. The parasitic diode D2, when viewed in FIG. 1, has its anode formed of the P diffusion regions 7 and 9 and the $P^+$ substrate 3 and its cathode formed of the $N^-$ epitaxial layer 5. In this preferred embodiment, the diodes D1 and D2 (i.e., the components 25, 23, 5, 3, 7, and 9 in FIG. 1) form an NPNP parasitic thyristor.

Next, the operation of the semiconductor device 1A is described with reference to FIGS. 1 and 2.

In order to turn on this semiconductor device (IGBT) 1A, when the collector terminal Tc is at a higher potential than the emitter terminal Te, a predetermined positive voltage is applied to the gate terminal Tg. This creates an inversion layer in a surface portion S1 of the P diffusion region 9 which is located directly below the first gate electrode 17, and causes electron injection from the emitter terminal Te, through the components 21, 13, and S1 into the N⁻ epitaxial layer 5 (this electron flow is from the emitter terminal Te through the diode D2 into the base of the PNP transistor Tr1 in FIG. 2). Along with this electron injection, in order to ensure charge neutrality of the N⁻ epitaxial layer 5, holes are injected from the collector terminal Tc through the components 19a and 11 into the N⁻ epitaxial layer 5 (this hole flow is from the collector terminal Tc through the emitter of the PNP transistor Tr1 into the base of the PNP transistor Tr1 in FIG. 2). The electron and hole injection increases the conductivity of the N⁻ epitaxial layer 5 (i.e., causes conductivity modulation) and reduces the turn-on voltage of the PNP transistor Tr1 consisting of the components 11, 5, 3, 7, and 9, thereby turning on the PNP transistor Tr1 (i.e., the semiconductor device 1A is turned on). By this turning on, current will flow from the collector terminal Tc through the components 19a, 11, and 5, through the component(s) 3 and/or 7 and/or 9, and through the component 21, in sequence, into the emitter terminal Te (this current flow is from the collector terminal Tc through the PNP transistor Tr1 into the emitter terminal Te in FIG. 2).

At this time, the diode D1 consisting of the components 23 and 25 prevents the electrons, which are injected in the N⁻ epitaxial layer 5, from outflowing from the N⁻ epitaxial layer 5 through the collector electrode 19b into the collector terminal Tc. Correspondingly, more electrons and holes are accumulated quickly in the N⁻ epitaxial layer 5, which contributes to the conductivity modulation of the N⁻ epitaxial layer 5 and allows the quick turning on of the semiconductor device 1A (with a turn-on speed equivalent to that of a non-collector-shorted IGBT).

On the other hand, in order to turn off the semiconductor device (IGBT) 1A, the application of a predetermined positive voltage to the gate terminal Tg is terminated. This eliminates the inversion layer in the surface portion S1 of the P diffusion region 9 and stops the electron injection from the emitter terminal Te through the inversion layer into the N⁻ epitaxial layer 5 as well as the hole injection from the collector terminal Tc into the N⁻ epitaxial layer 5. This gradually reduces the conductivity modulation of the N⁻ epitaxial layer 5 caused by the electron and hole injection and increases the turn-on voltage of the PNP transistor Tr1 consisting of the components 11, 5, 3, 7, and 9, thereby turning off the PNP transistor Tr1 (i.e., the semiconductor device 1A is turned off). By this turning off, current will stop flowing from the collector terminal Tc through the components 19a, 11, and 5, through the component(s) 3 and/or 7 and/or 9, and through the component 21, in sequence, into the emitter terminal Te.

When the emitter terminal Te is at a higher potential than the collector terminal Tc, initially a reverse current flows from the emitter terminal Te through the component 21, through the component(s) 9 and/or 7 and/or 3, through the components 5, 29, 27, 23, 25, and 19b into the collector terminal Tc (this reverse current flow is from the emitter terminal Te through the diodes D2 and D1 into the collector terminal Tc in FIG. 2). Thereby, the NPNP parasitic thyristor consisting of the components 25, 23, 5, 3, 7, and 9 (the thyristor consisting of the diodes D1 and D2 in FIG. 2) is turned on. By this turning on, the above reverse current flow ultimately becomes the flow from the emitter terminal Te through the component 21, through the component(s) 9 and/or 7 and/or 3, and through the components 5, 23, 25, and 19b into the collector terminal Tc (this reverse current flow is from the emitter terminal Te through the diodes D2 and D1 into the collector terminal Tc in FIG. 2). Since the components 25, 23, 5, and 3 each have a low conducting resistance during the on-state of the parasitic thyristor, the ultimate reverse current can flow from the emitter terminal Te into the collector terminal Tc with little influence from the conducting resistance. This achieves the reverse conducting capability with low reverse conducting resistance.

In the semiconductor device 1A of the above structure, the P diffusion region 23 is formed in the surface of the N⁻ epitaxial layer 5; the N⁺ diffusion region 25 is formed in the surface of the P diffusion region 23 so as to be surrounded by the P diffusion region 23; and the second collector electrode 19b connected to the first collector electrode 19a is formed on the N⁺ diffusion region 25. Thus, the diode D1 consisting of the components 23 and 25 can prevent electrons, which are injected from the emitter electrode 21 into the N⁻ epitaxial layer 5 during the on-state of the semiconductor device 1A, from outflowing from the N⁻ epitaxial layer 5 into the second collector electrode 19b. Correspondingly, more electrons and holes can be accumulated quickly in the N⁻ epitaxial layer 5, which contributes to the conductivity modulation of the N⁻ epitaxial layer 5 and allows the quick turning on of the semiconductor device 1A.

Further, since the P diffusion region 23 is formed in the surface of the N⁻ epitaxial layer 5 and the N⁺ diffusion region 25 is formed in the surface of the P diffusion region 23 so as to be surrounded by the P diffusion region 23, a parasitic thyristor consisting of those components 23 and 25 and of the existing components 5, 3, 7, and 9 can be formed on the reverse conducting path (from the emitter terminal Te through the component 21, through the component(s) 9 and/or 7 and/or 3, and through the components 5, 23, 25, and 19b to the collector terminal Tc). Thus, by utilizing a low conducting resistance during the on-state of the parasitic thyristor, the semiconductor device 1A can achieve the reverse conductivity capability with low reverse conducting resistance.

Further, since the electrode 27 is provided on and extends through the P diffusion region 23 and the N⁻ epitaxial layer 5 to form a conducting path from the N⁻ epitaxial layer 5 to the P diffusion region 23, the passage of current from the N⁻ epitaxial layer 5 to the P diffusion region 23 can be ensured during reverse conduction of the semiconductor device 1A. This stabilizes the turning on of the parasitic thyristor. Since, in this preferred embodiment, the electrode 27 is provided on the N⁻ epitaxial layer 5 with the N⁺ diffusion region 29 in between, a good electrical connection can be ensured between the electrode 27 and the N⁻ epitaxial layer 5.

Furthermore, the semiconductor device 1A can be constructed at low cost because the diode D1 for reverse conduction is not an external device.

While in this preferred embodiment, the P diffusion region 9 is formed on the one end h1 of the N⁻ epitaxial layer 5; the P diffusion region 11 is formed in the central portion of the N⁻ epitaxial layer 5; and the P diffusion region 25 and the N⁺ diffusion region 29 are formed on the other end h2 of the N⁻ epitaxial layer 5, the structure may be such that the P diffusion regions 9 and 11 are formed on the one end h1 of the N⁻ epitaxial layer 5; and the P diffusion region 25 and the N⁺ diffusion region 29 are formed in the central portion of the N⁻ epitaxial layer 5. This shortens the interval between the P diffusion region 9 and the N⁺ diffusion region 29 and accordingly reduces a conduction distance in the N⁻ epitaxial layer 5 during reverse conduction (from the emitter terminal Te through the component 21, through the component(s) 9 and/or 7 and/or 3, and through the components 5, 29, 27, 23, 25, and 19b into the collector terminal Tc), thereby achieving the reverse conducting capability with lower reverse conducting resistance.

Second Preferred Embodiment

Figure 3:
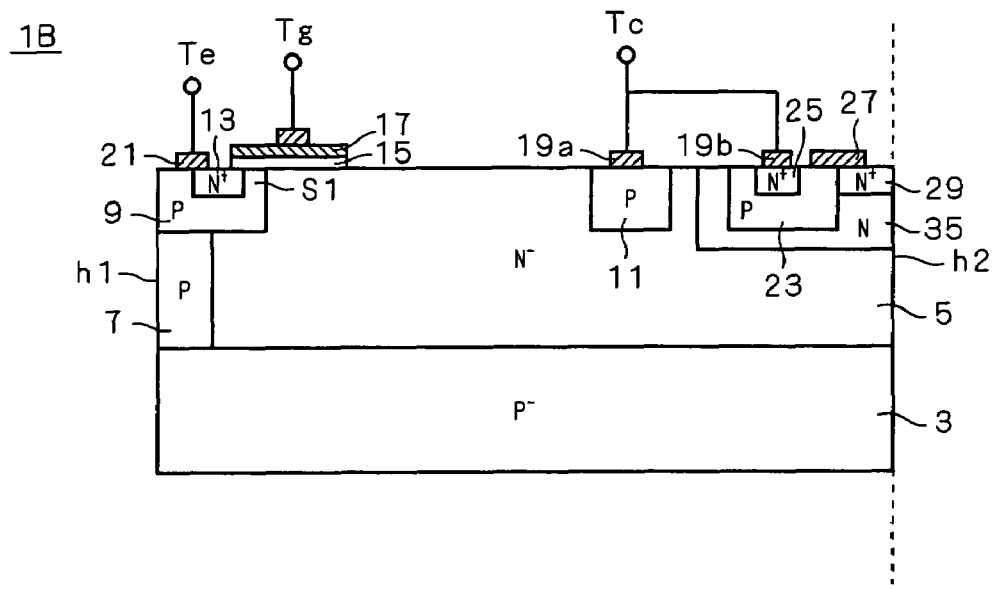
FIG. 3 is a cross-sectional view of a semiconductor device according to a second preferred embodiment.

A semiconductor device 1B according to this preferred embodiment is, as shown in FIG. 3, constructed such that in the aforementioned first preferred embodiment, an N diffusion region (semiconductor region of the second conductivity type) 35 having a higher carrier density than the N⁻ epitaxial layer 5 is further formed between the N⁻ epitaxial layer 5 (semiconductor layer) and the P diffusion region 23 (fourth semiconductor region) to surround the P diffusion region 23.

In the semiconductor device 1A of the aforementioned first preferred embodiment, with reference to FIGS. 1 and 2, the formation of the diode D1 consisting of the components 23 and 25 for reverse conduction in the N⁻ epitaxial layer 5 creates a parasitic PNP transistor whose emitter, base, and collector are formed respectively of the components 11, 5, and 23 (a dotted line 55 in FIG. 2 indicates the collector of this parasitic PNP transistor). When the collector terminal Tc is at a higher potential than the emitter terminal Te, a forward bias is applied to turn on this parasitic PNP transistor. By this turning on, some holes flowing from the collector terminal Tc through the electrode 19a into the P diffusion region 11 will flow into the electrode 27 through the components 11, 5, 23 of the parasitic PNP transistor. Those holes will then disappear in the electrode 27 after being recombined with electrons which have flown from the emitter terminal Te through the components 21, 13, S1, 5, and 29 into the electrode 27. This hinders, in the semiconductor device 1A, the accumulation of holes from the collector terminal Tc and electrons from the emitter terminal Te in the N⁻ epitaxial layer S and causes insufficient conductivity modulation of the N⁻ epitaxial layer 5, thereby slowing the turning on of the transistor Tn consisting of the components 11, 5, and 3. On the other hand, in this preferred embodiment, as shown in FIG. 3, the presence of the N diffusion region 35 cuts off the flow of holes in the components 11, 5, and 23 and prevents the disappearance of holes described above, thus allowing the quick turning on of the transistor Tn.

Accordingly, the semiconductor device 1B of the above structure can, in addition to achieving the aforementioned effect of the first preferred embodiment, also improve the turn-on behavior of the transistor Tr1 with a simple structure, since the N diffusion region 35 with a higher carrier density than the N⁻ epitaxial layer 5 is formed between the N⁻ epitaxial layer 5 and the P diffusion region 23 to surround the P diffusion region 23.

Third Preferred Embodiment

Figure 4:
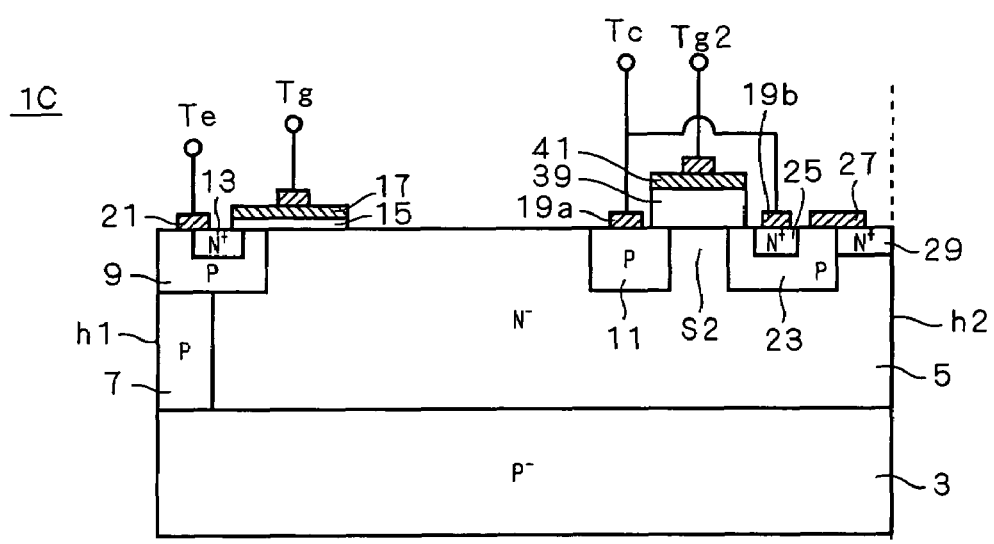
FIG. 4 is a cross-sectional view of a semiconductor device according to a third preferred embodiment.

A semiconductor device 10 according to this preferred embodiment is, as shown in FIG. 4, constructed such that in the aforementioned first preferred embodiment, a second gate electrode 41 is further provided on a surface portion of the N⁻ epitaxial layer 5 (semiconductor layer) which is sandwiched between the P diffusion regions 11 and 23 (second and fourth semiconductor regions), with a second gate insulating film 39 in between; and a second gate terminal Tg2 is connected to the second gate electrode 41. That is, this semiconductor device IC is such that a P-channel MOSFET Q2 (see FIG. 5) whose drain and source are formed respectively of the P diffusion regions 11 and 23 is further added to the aforementioned first preferred embodiment.

Here, the second gate insulating film 39 is formed to approximately a thickness of field oxide film so that the semiconductor device 1C can withstand high voltage.

Figure 5:
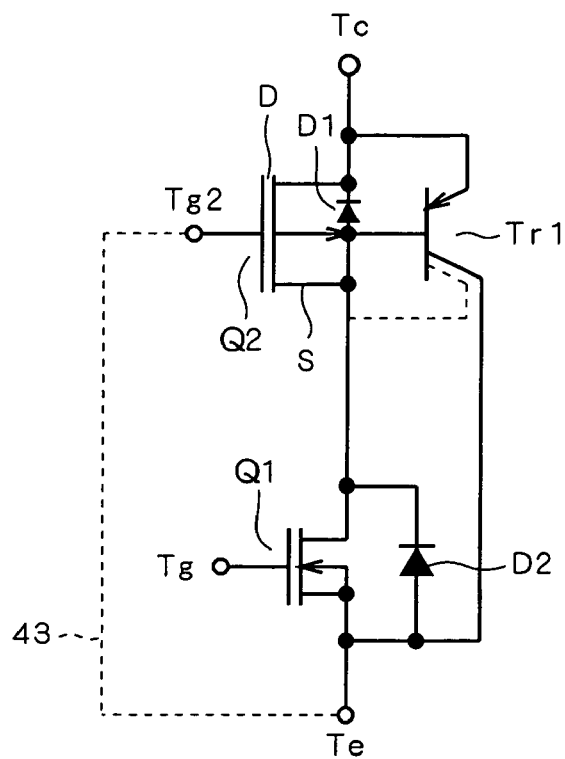
FIG. 5 is an equivalent circuit diagram of the semiconductor device 1*n* FIG. 4.

The equivalent circuit of the semiconductor device 1C is, as shown in FIG. 5, a circuit in which the above P-channel MOSFET Q2 is added to the equivalent circuit of the aforementioned first preferred embodiment (FIG. 2) in such a way that the diode D1 is connected in parallel between the drain and source of the p-channel MOSFET Q2.

In this semiconductor device 1C, with reference to FIGS. 4 and 5, when a predetermined negative voltage is not applied to the second gate terminal Tg2 (i.e., when the P-channel MOSFET Q2 is off), there is no continuity between the P diffusion regions 11 and 23. Thus, the semiconductor device 1C in this case is substantially identical in structure to and operates in the same way as the semiconductor device 1A of the first preferred embodiment. That is, the semiconductor device (IGBT) 1C turns on quickly but turns off rather slowly.

On the other hand, when a predetermined negative voltage is applied to the second gate terminal Tg2 (i.e., the P-channel MOSFET Q2 is on), an inversion layer is formed in a surface portion S2 of the N⁻ epitaxial layer 5 which is located directly below the second gate electrode 41 to provide continuity between the P diffusion regions 11 and 23. Thus, the semiconductor device 1C in this case is substantially identical in structure to and operates in the same way as the collector-shorted IGBT of conventional structure (first conventional example). That is, as previously described in the first conventional example, the semiconductor device (IGBT) 1C turns off quickly but turns on rather slowly.

In order to turn on the semiconductor device 1C (i.e., when the collector terminal Tc is at a higher potential than the emitter terminal Te and a predetermined voltage is applied to the gate terminal Tg; or when the N-channel MOSFET Q1 is turned on), the P-channel MOSFET Q2 is turned off by not applying a predetermined negative voltage to the second gate terminal Tg2. By so doing, the structure of the semiconductor device 1C is switched to that of the semiconductor device 1A so that the semiconductor device 1C can be turned on just like the semiconductor device 1A. This allows the semiconductor device 1C to turn on quickly.

On the other hand, in order to turn off the semiconductor device 1C (i.e., when the application of a predetermined positive voltage to the gate terminal Tg is terminated; or when the N-channel MOSFET Q1 is turned off), the P-channel MOSFET Q2 is turned on by applying a predetermined negative voltage to the second gate terminal Tg2. By so doing, the structure of the semiconductor device 1C is switched to the conventional structure of the collector-shorted IGBT (first conventional example) so that the semiconductor device 1C can be turned off just like the collector-shorted IGBT of conventional structure. This allows the semiconductor device 1C to turn off quickly.

The application of a predetermined negative voltage to the second gate terminal Tg2 and the termination of that voltage application (i.e., on-off control of the P-channel MOSFET Q2), described above, may be implemented by a predetermined external circuit. Or, they may automatically be implemented simultaneously with the application of a predetermined positive voltage to the first gate terminal Tg or with the termination of that voltage application (i.e., on-off control of the N-channel MOSFET Q1), by short circuiting the terminals Tg2 and Te as shown by a dotted line 43 of FIG. 5 to fix both the terminals Tg2 and Te at the same potential.

More specifically, when both the terminals Tg2 and Te are short circuited as shown by the dotted line 43 of FIG. 5 to be fixed at the same potential, and with reference to FIG. 5, when the N-channel MOSFET Q1 is turned off, the current flow from the collector terminal Tc to the emitter terminal Te is stopped. This increases the potential of the collector terminal Tc and accordingly the potential of the drain D of the P-channel MOSFET Q2. This increase in the potential of the drain D causes a relative reduction in the potential of the second gate terminal Tg2 and brings the second gate terminal Tg2 into the same condition as when a predetermined negative voltage is applied. Accordingly, the P-channel MOSFET Q2 is turned on. By this turning on, the equivalent circuit of FIG. 5 becomes substantially identical to the conventional structure of the collector-shorted IGBT (first conventional example), so the transistor Tr1 can quickly be turned off.

On the other hand, when the N-channel MOSFET Q1 is turned on, current will flow from the collector terminal Tc to the emitter terminal Te. This reduces the potential of the collector terminal Tc and accordingly reduces the potential of the drain D of the P-channel MOSFET Q2. This reduction in the potential of the drain D stops the reduction in the potential of the second gate terminal Tg2 relative to the potential of the drain D and brings the second gate terminal Tg2 into the same condition as when the application of a predetermined negative voltage is terminated. Accordingly, the P-channel MOSFET Q2 is turned off. By this turning off, the equivalent circuit of FIG. 5 becomes substantially identical to that of the semiconductor device 1A of the first preferred embodiment (FIG. 2), so the transistor Tr1 can quickly be turned on.

In this way, when both the terminals Tg2 and Te are short circuited to be fixed at the same potential, the control of voltage applied to the second gate terminal Tg2 can be implemented with a simple interconnection and without the use of an external circuit.

In the semiconductor device 1C of the above structure, the second gate electrode 41 is provided on the surface portion of the N⁻ epitaxial layer 5 which is sandwiched between the P diffusion regions 11 and 23, with the second gate insulating film 39 in between, that is, the P-channel MOSFET Q2 is provided whose drain and source are formed respectively of the P diffusion regions 11 and 23. Thus, by controlling continuity and non-continuity between the P diffusion regions 11 and 23 through the on-off control of the P-channel MOSFET Q2, the semiconductor device 1C can, in addition to achieving the aforementioned effect of the first preferred embodiment, also selectively switch between two structures: the one substantially identical to the conventional structure of the collector-shorted IGBT (first conventional example); and the one substantially identical to that of the semiconductor device 1A according to the aforementioned first preferred embodiment. Therefore, in turn-on of the semiconductor device 1C, the P-channel MOSFET Q2 is turned off so that the semiconductor device 1C can quickly be turned on just like the semiconductor device 1A, while in turn-off of the semiconductor device 1C, the P-channel MOSFET Q2 is turned on so that the semiconductor device 1C can quickly be turned off just like the collector-shorted IGBT of conventional structure. This achieves a lateral collector-shorted IGBT which can turn both on and off quickly.

Fourth Preferred Embodiment

Figure 6:
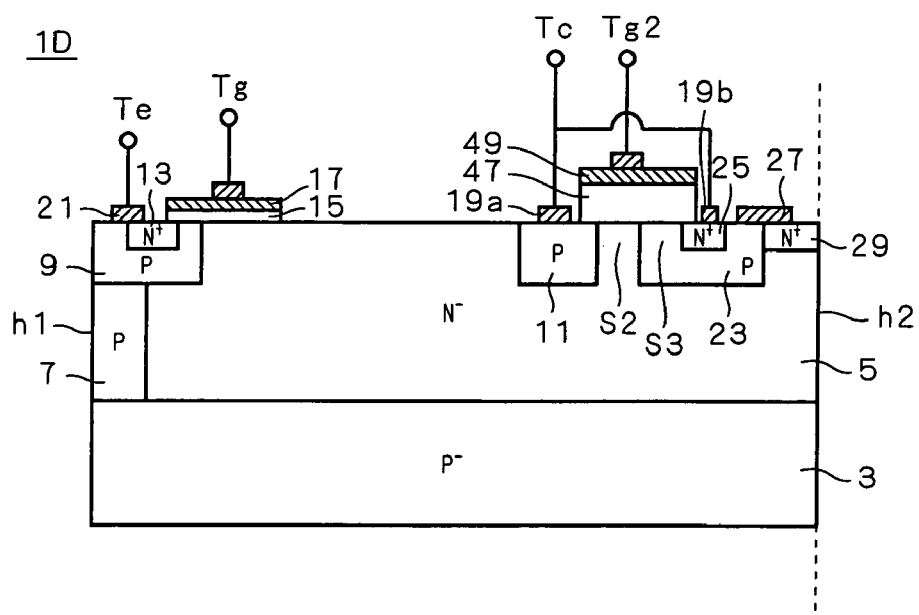
FIG. 6 is a cross-sectional view of a semiconductor device according to a fourth preferred embodiment.

A semiconductor device 1D according to this preferred embodiment is, as shown in FIG. 6, constructed such that in the aforementioned first preferred embodiment, a second gate electrode 49 is further provided through surface portions of the N⁻ epitaxial layer 5 (semiconductor layer) and the P diffusion region 23 (fourth semiconductor region) which are sandwiched between the P diffusion region 11 (second semiconductor region) and the N⁺ diffusion region 25 (fifth semiconductor region), with a gate insulating film 47 in between; and the second gate terminal Tg2 is connected to the second gate electrode 49.

In other words, this semiconductor device 1D is such that, in the aforementioned third preferred embodiment, the second gate insulating film 39 and the second gate electrode 41 extend through the surface portions of the N⁻ epitaxial layer 5 and the P diffusion region 23 which are sandwiched between the P diffusion region 11 and the N⁺ diffusion region 25. That is, this semiconductor device 1D is constructed by adding to the aforementioned third preferred embodiment (FIG. 4), an N-channel MOSFET Q3 whose drain D and source S are formed respectively of the components 25 and 5 and which has a common gate with the P-channel MOSFET Q2 whose drain D, source S, and gate Tg2 are formed respectively of the components 11, 23, and 41.

Here, the second gate insulating film 47 is formed to approximately a thickness of field oxide film so that the semiconductor device 1D can withstand high voltage.

Figure 7:
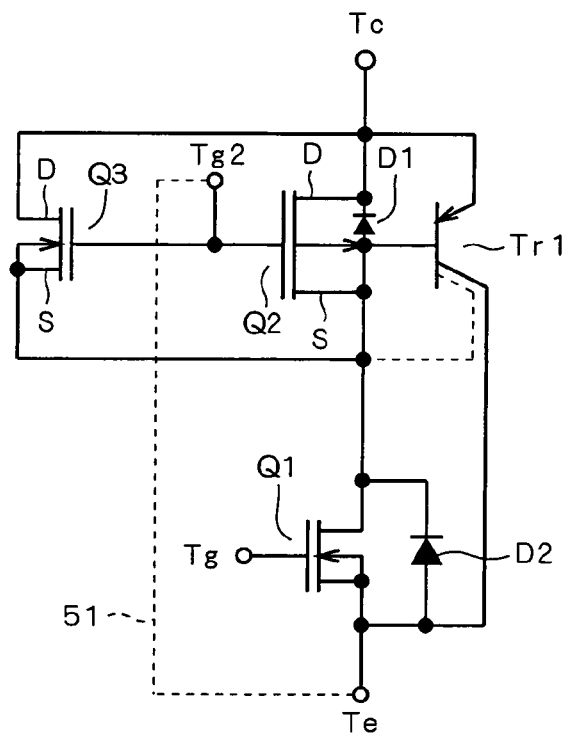
FIG. 7 is an equivalent circuit diagram of the semiconductor device shown in FIG. 6.

The equivalent circuit of the semiconductor device 1D is, as shown in FIG. 7, a circuit in which the above N-channel MOSFET Q3 is added to the equivalent circuit of the aforementioned third preferred embodiment (FIG. 5) in such a way that the diode D1 is connected in parallel between the drain and source of the N-channel MOSFET Q3 and that the second gate terminal Tg2 is connected to the gate of the N-channel MOSFET Q3.

In this semiconductor device 1D, when the collector terminal Tc is at a higher potential than the emitter terminal Te, the control of voltage applied to the terminals Tg and Tg2 is done in the same way as in the aforementioned third preferred embodiment (that is, when a predetermined positive voltage is applied to the first gate terminal Tg to turn on the N-channel MOSFET Q1, the P-channel MOSFET Q2 is turned off by not applying voltage to the second gate terminal Tg2; while, when the application of a predetermined positive voltage to the first gate terminal Tg is terminated, the P-channel MOSFET Q2 is turned on by applying a predetermined negative voltage to the second gate terminal Tg2). During this control, the N-channel MOSFET Q3 is off. Thus, the semiconductor device 1D becomes substantially identical in structure to the semiconductor device 1C of the third preferred embodiment and turns on or off just like the semiconductor device 1C. This allows the semiconductor device 1D to turn both on and off quickly.

On the other hand, when the emitter terminal Te is at a higher potential than the collector terminal Tc (in the case of reverse conduction), a predetermined positive voltage is applied to the second gate terminal Tg2 to turn on the N-channel MOSFET Q3 (i.e., an inversion layer is formed in a surface portion S3 of the P diffusion region 23 which is located directly below the second gate electrode 49 so that continuity is established by the inversion layer between the components 5 and 25). This, with reference to FIG. 7, additionally provides a second reverse conducting path from the emitter terminal Te through the diode D2 and the N-channel MOSFET Q3 to the collector terminal Tc in parallel with a first reverse conducting path from the emitter terminal Te through the diodes D2 and D1 to the collector terminal Tc. Those first and second conducting paths achieve the reverse conducting capability with lower reverse conducting resistance.

In FIG. 6, the first reverse conducting path given above is from the emitter terminal Te through the component 21, through the component(s) 7 and/or 9 and/or 3, and through the components 5, 29, 27, 23, 25, and 19b to the collector terminal Tc, and the second reverse conducting path given above is from the emitter terminal Te through the component 21, through the component(s) 7 and/or 9 and/or 3, and through the components 5, S3, 25, and 19b to the collector terminal Tc.

The application of voltage to the second gate terminal Tg2 may be implemented by a predetermined external circuit or, as in the aforementioned third preferred embodiment, may be implemented automatically by short circuiting the terminals Tg2 and Te as shown by a dotted line 51 of FIG. 7 to fix both the terminals Tg2 and Te at the same potential.

In the latter case, with reference to FIG. 7, when the collector terminal Tc is at a higher potential than the emitter terminal Te, and when the N-channel MOSFET Q1 is turned on or off by the application of a predetermined positive voltage to the first gate terminal Tg or by the termination of that voltage application, the P-channel MOSFET Q2 is turned on or off, and accordingly, the transistor Tr1 is quickly turned on or off in the same way as in the aforementioned third preferred embodiment. On the other hand, when the emitter terminal Te is at a higher potential than the collector terminal Tc, the potential of the gate Tg2 of the N-channel MOSFET Q3 becomes higher than that of the drain D of the N-channel MOSFET Q3, and the second gate terminal Tg2 is brought into substantially the same condition as when a predetermined positive voltage is applied. Accordingly, the N-channel MOSFET Q3 is turned on. This provides the second reverse conducting path (from the emitter terminal Te through the diode D2 and the N-channel MOSFET Q3 to the collector terminal Tc in FIG. 7) in parallel with the first reverse conducting path (from the emitter terminal Te through the diodes D2 and D1 to the collector terminal Tc in FIG. 7). Thus, in the latter case, the control of voltage applied to the second gate terminal Tg2 can be implemented with a simple interconnection and without the use of an external circuit.

In the semiconductor device 1D of the above structure, the second gate electrode 49 is also provided on the surface portion of the P diffusion region 23 which is sandwiched between the N⁻ epitaxial layer 5 and the N⁺ diffusion region 25, with the second gate insulating film 47 in between, that is, the N-channel MOSFET Q3 is provided whose drain and source are formed respectively of the components 25 and 5. Thus, by controlling continuity and non-continuity between the components 25 and 5 through the on-off control of the N-channel MOSFET Q3, the second reverse conducting path passing through the above N-channel MOSFET Q3 can be formed in parallel with the first reverse conducting path passing through the diode D1 consisting of the components 23 and 25. Thus, when the emitter terminal Te is at a higher potential than the collector terminal Tc, the presence of those parallel first and second reverse conducting paths can achieve the reverse conducting capability with lower reverse conducting resistance.

Further, since the second gate electrode 49 is provided also on the surface portion of the N⁻ epitaxial layer 5 which is sandwiched between the P diffusion regions 11 and 23, with the second gate insulating film 47 in between, that is, the P-channel MOSFET Q2 is provided whose drain and source are formed respectively of the P diffusion regions 11 and 23, the semiconductor device 1D can achieve the same effect as the semiconductor device 1C of the aforementioned third preferred embodiment.

Further, the MOSFETs Q2 and Q3 can be formed with a simple structure and a small space, because they are formed through the formation of the second gate electrode 49 which extends through the surface portions of the N⁻ epitaxial layer 5 and the P diffusion region 23 which are sandwiched between the P diffusion region 11 and the N⁺ diffusion region 25, with the second gate insulating film 47 in between.

While this preferred embodiment forms both the MOSFETs Q2 and Q3, only the MOSFET Q3 may be formed singly.

Fifth Preferred Embodiment

Figure 8:
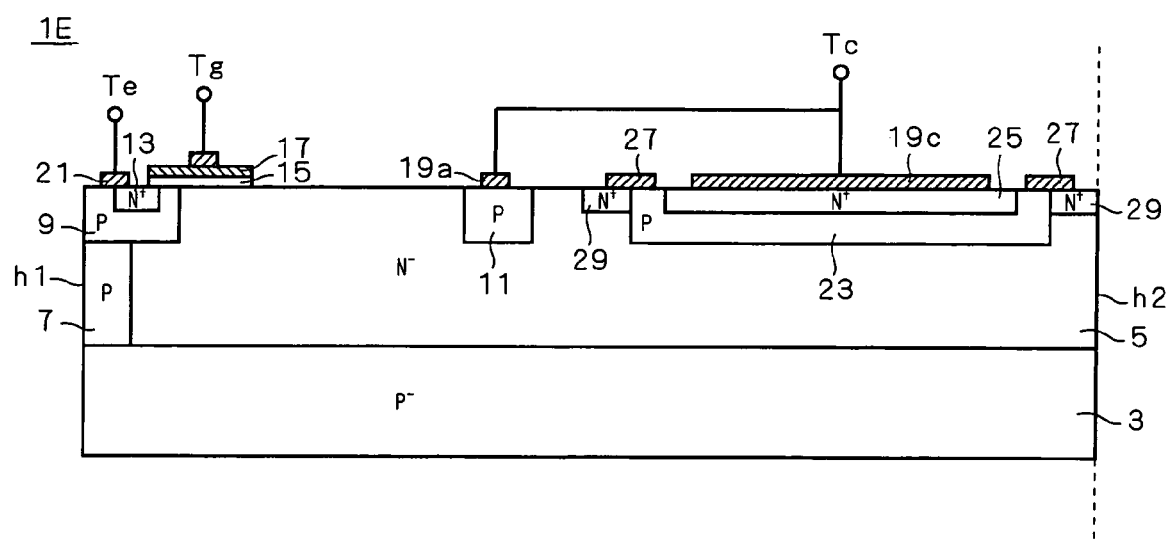
FIG. 8 is a cross-sectional view of a semiconductor device according to a fifth preferred embodiment.

A semiconductor device 1E according to this preferred embodiment is, as shown in FIG. 8, constructed such that in the aforementioned first preferred embodiment, the P diffusion region 23 (fourth semiconductor region) and the N⁺ diffusion region 25 (fifth semiconductor region), both of which constitute the diode D1 for reverse conduction, are formed in the underlying layer of a pad 19c which is formed on the N⁻ epitaxial layer 5 (semiconductor layer) for connection with the collector terminal Tc.

The pad 19c for connection with the collector terminal Tc is surrounded by the emitter electrode 21 and typically formed on the N⁻ epitaxial layer 5 without being drawn out from the collector electrode 19a into the outside of the emitter electrode 21. Thus, the underlying layer of the pad 19c is useless as a device and is wasted. In the semiconductor device 1E, therefore, the underlying layer of the pad 19c is utilized as a region for forming the components 23 and 25 of the diode D1 for reverse conduction. This eliminates the need to increase the area of the semiconductor device 1E for formation of the components 23 and 25 and thus prevents a reduction in the share of the IGBT in the semiconductor device 1E. This substantially reduces the conducting resistance in the semiconductor device 1E and improves the turn-on and turn-off behavior of the semiconductor device 1E.

Accordingly, the semiconductor device 1E of the above structure can, in addition to achieving the aforementioned effect of the first preferred embodiment, also improve its turn-on and turn-off behavior, because the components 23 and 25 constituting the diode D1 for reverse conduction are formed in the underlying layer of the pad 19c which is formed on the N⁻ epitaxial layer 5 for connection with the collector terminal Tc.

Sixth Preferred Embodiment

Figure 9:
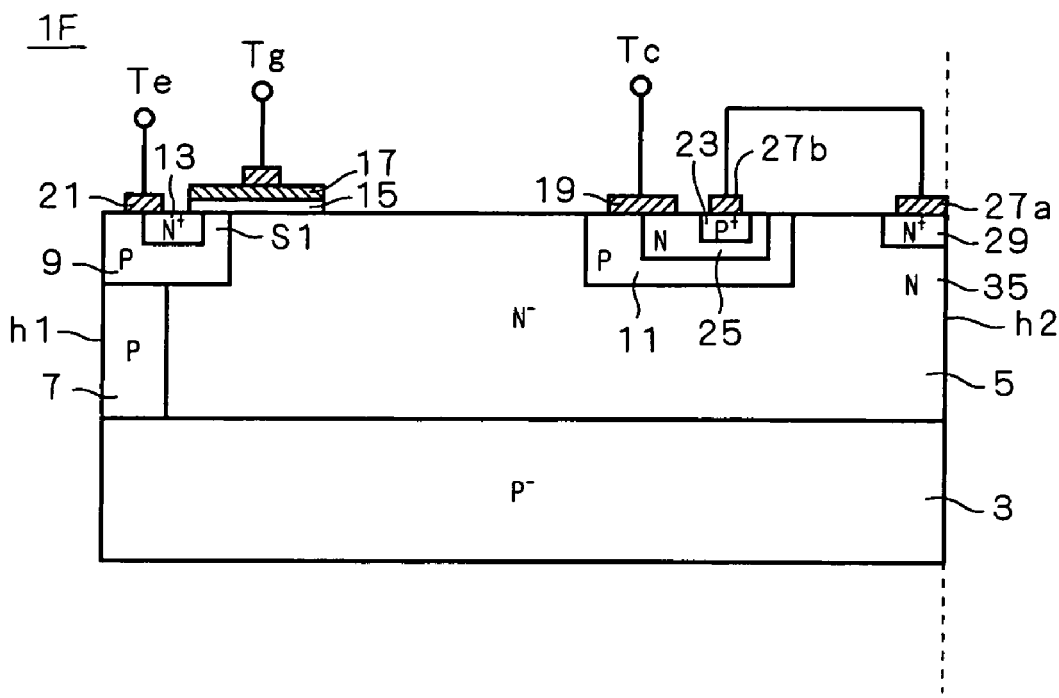
FIG. 9 is a cross-sectional view of a semiconductor device according to a sixth preferred embodiment.

A semiconductor device 1F according to this preferred embodiment includes, as shown in FIG. 9, the P⁺ substrate 3 (semiconductor substrate of a first conductivity type); the N⁻ epitaxial layer 5 (semiconductor layer of a second conductivity type) formed in one main surface of the P⁺ substrate 3; the P diffusion region 9 (first semiconductor region of the first conductivity type) formed in the surface of the N⁻ epitaxial layer 5 and connected to the P⁺ substrate 3 through the P diffusion region 7 (semiconductor region of the first conductivity type); the P diffusion region 11 (second semiconductor region of the first conductivity type) formed in the surface of the N⁻ epitaxial layer 5 apart from the P diffusion region 9; the N⁺ diffusion region 13 (third semiconductor region of the second conductivity type) formed in the surface of the P diffusion region 9 so as to be surrounded by the P diffusion region 9; the first gate electrode 17 provided on the surface portion of the P diffusion region 9 which is sandwiched between the N⁺ diffusion region 13 and the N⁻ epitaxial layer 5, with the first gate insulating film 15 in between; a collector electrode 19 connected to the P diffusion region 11; and the emitter electrode 21 connected to the P diffusion region 9 and the N⁺ diffusion region 13. In addition to this fundamental structure, the semiconductor device 1F further includes an N diffusion region 25 (fourth semiconductor region of the second conductivity type) which is formed in the surface of the P diffusion region 11 so as to be surrounded by the P diffusion region 11 and which is connected to the collector electrode 19; a P⁺ diffusion region (fifth semiconductor region of the first conductivity type) 23 formed in the surface of the N diffusion region 25 so as to be surrounded by the N diffusion region 25; and electrodes 27a and 27b connected respectively to the N⁻ epitaxial layer 5 (semiconductor layer) and the P⁺ diffusion region 23 to form a conducting path from the N⁻ epitaxial layer 5 to the P⁺ diffusion region 23. The electrode 27a is provided on the N⁻ epitaxial layer 5 with an N⁺ diffusion region 29 formed in the surface of the N⁻ epitaxial layer 5 in between so as to form an ohmic contact with the N⁻ epitaxial layer 5. The electrode 27b is provided on the P⁺ diffusion region 23 and electrically connected to the electrode 27a. In this preferred embodiment, the components corresponding to those in the aforementioned first preferred embodiment are denoted by the same reference numerals and characters.

The semiconductor device 1F is, in other words, such that in the aforementioned first preferred embodiment, the components 23 and 25 constituting the diode D1 for reverse conduction are formed in the P diffusion region 11.

The electrodes 27a and 27b of this preferred embodiment correspond respectively to a portion of the electrode 27 which is provided on the N⁺ diffusion region 29 and a portion of the electrode 27 which is provided on the P diffusion region 23 in the aforementioned first preferred embodiment (FIG. 1). Also, a portion of the electrode 19 which is provided on the P diffusion region 11 and a portion of the electrode 19 which is provided on the N diffusion region 25 in this preferred embodiment correspond respectively to the electrodes 19a and 19b in the aforementioned first preferred embodiment. Considering these correspondences, the operation of the semiconductor device 1F is identical to that of the semiconductor device 1A of the aforementioned first preferred embodiment, so the description thereof is omitted.

In this semiconductor device 1F, the formation of the diode consisting of the components 23 and 25 for reverse conduction in the P diffusion region 11 creates a parasitic PNP transistor whose emitter, base, and collector are formed respectively of the components 11, 25, and 23. However, since the base and emitter of this parasitic PNP transistor are short circuited via the electrode 19, the parasitic PNP transistor is never turned on. Thus, during turn-on of the semiconductor device 1F, there is no such a case that some holes flowing from the collector terminal Tc through the electrode 19 into the P diffusion region 11 will flow into the electrode 27b through the components 11, 25, and 23 and then disappear in the electrode 27b after recombined with electrons which has flown from the emitter terminal Te through the components 21, S1, 5, 29, and 27a into the electrode 27b. Accordingly, the formation of the diode consisting of the components 23 and 25 for reverse conduction does not result in the disappearance of holes described above. This facilitates the accumulation of holes and electrons in the N⁻ epitaxial layer 5 and thus allows the quick turning on of the transistor Tr1 consisting of the components 11, 5, and 3.

In the semiconductor device 1F of the above structure, the N diffusion region 25 is formed in the surface of the P diffusion region 11 so as to be surrounded by the P diffusion region 11; the P⁺ diffusion region 23 is formed in the surface of the N diffusion region 25 so as to be surrounded by the N diffusion region 25; and the collector electrode 19 is provided on and extends through the components 11 and 25 so as to short circuit those components 11 and 25. Thus, the semiconductor device 1F can, in addition to achieving the aforementioned effect of the first preferred embodiment, have the diode consisting of the components 23 and 25 for reverse conduction without inhibiting the turning on of the transistor consisting of the components 11, 5, 3, 7, and 9.

Seventh Preferred Embodiment

Figure 10:
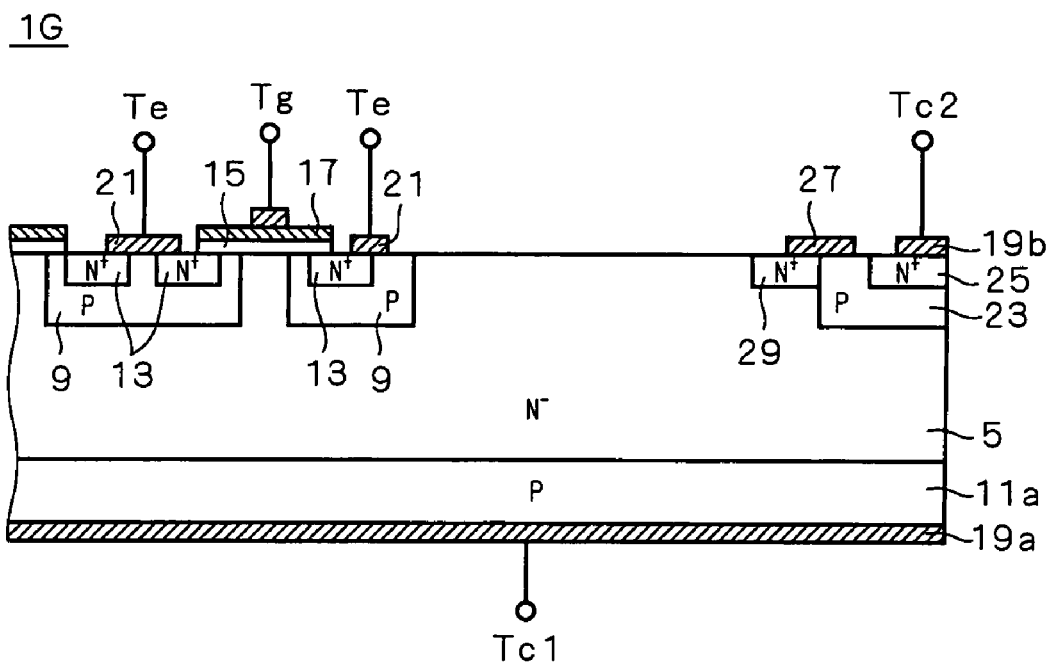
FIG. 10 is a cross-sectional view of a semiconductor device according to a seventh preferred embodiment.

A semiconductor device 1G according to this preferred embodiment is a vertical collector-shorted IGBT. It includes, as shown in FIG. 10, the N⁻ epitaxial layer 5 (semiconductor layer of a second conductivity type); the P diffusion regions 9 (first semiconductor regions of a first conductivity type) formed in one main surface of the N⁻ epitaxial layer 5; the N⁺ diffusion regions 13 (second semiconductor regions of the second conductivity type) formed in the surfaces of the P diffusion regions 9 so as to be surrounded by the P diffusion region 9; the first gate electrode 17 provided on the surface portions of the P diffusion regions 9 which are sandwiched between the N⁻ epitaxial layer 5 and the N⁺ diffusion regions 13, with the first gate insulating film 15 in between; a P diffusion region 11a (third semiconductor region of the first conductivity type) formed on the other main surface of the N⁻ epitaxial layer 5; the first collector electrode 19a provided on the surface of the P diffusion region 11a; and the emitter electrodes 21 connected to the P diffusion regions 9 and the N⁺ diffusion regions 13. In addition to this fundamental structure, this semiconductor device 1G further includes the P diffusion region 23 (fourth semiconductor region of the first conductivity type) formed in the surface of the N⁻ epitaxial layer 5 apart from the P diffusion regions 9; the N⁺ diffusion region 25 (fifth semiconductor region of the second conductivity type) formed in the surface of the P diffusion region 23 so as to be surrounded by the P diffusion region 23; the second collector electrode 19b provided on the N⁺ diffusion region 25 and applied with the same voltage as the first collector electrode 19a; and the electrode 27 connected to the P diffusion region 23 and the N⁻ epitaxial layer 5 to form a conducting path from the N⁻ epitaxial layer 5 to the P diffusion region 23. The electrode 27 is provided on the N⁻ epitaxial layer 5 with the N⁺ diffusion region 29 formed in the surface of the N⁻ epitaxial layer 5 in between so as to form an ohmic contact with the N⁻ epitaxial layer 5. In this preferred embodiment, the components corresponding to those in the aforementioned first preferred embodiment are denoted by the same reference numerals and characters.

The first gate electrode 17 is connected to the gate terminal Tg, the emitter electrode 21 to the emitter terminal Te, and the first and second collector electrodes 19a and 19b respectively to first and second collector terminals Tc1 and Tc2.

This semiconductor device 1G is, in other words, such that the aforementioned first preferred embodiment is applied to a lateral IGBT.

The P diffusion region 11a corresponds to the P diffusion region 11 in the first preferred embodiment, and the first collector electrode 19a corresponds to the collector electrode 19a in the aforementioned first preferred embodiment. The first and second collector terminals Tc1 and Tc2 both correspond to the collector terminal Tc in the first preferred embodiment, and they are applied with the same voltage. This semiconductor device 1G does not include components which correspond to the P diffusion region 7 and the P⁺ substrate 3 in the aforementioned first preferred embodiment. Considering these correspondences, the operation of the semiconductor device 1F is identical to that of the semiconductor device 1A of the aforementioned first preferred embodiment, so the description thereof is omitted.

In the semiconductor device 1G of the above structure, as in the aforementioned first preferred embodiment, the P diffusion region 23 is formed in the surface of the N⁻ epitaxial layer 5; the N⁺ diffusion region 25 is formed in the surface of the P diffusion region 23 so as to be surrounded by the P diffusion region 23; and the second collector electrode 19b applied with the same voltage as the first collector electrode 19a is provided on the N⁺ diffusion region 25. Thus, the diode consisting of the components 23 and 25 prevents electrons, which are injected from the emitter electrode 21 in the N⁻ epitaxial layer 5 during turn-on of the semiconductor device 1G, from outflowing from the N⁻ epitaxial layer 5 into the second collector electrode 19b. Correspondingly, more electrons and holes are accumulated quickly in the N⁻ epitaxial layer 5, which contributes to the conductivity modulation of the N⁻ epitaxial layer 5 and allows the quick turning on of the semiconductor device 1G.

Further, since the P diffusion region 23 is formed in the surface of the N⁻ epitaxial layer 5, and the N⁺ diffusion region 25 is formed in the surface of the P diffusion region 23 so as to be surrounded by the P diffusion region 23, a parasitic thyristor consisting of those components 23 and 25 and of the existing components 5 and 9 can be formed on a reverse conducting path (from the emitter terminal Te through the components 21, 9, 5, 23, 25, and 19b to the collector terminal Tc). Thus, by utilizing a low conducting resistance during the on-state of the parasitic thyristor, the semiconductor device 1G can achieve the reverse conducting capability with low reverse conducting resistance.

Further, since the electrode 27 is provided on and extends through the P diffusion region 23 and the N⁻ epitaxial layer 5 to form a conducting path from the N⁻ epitaxial layer 5 to the P diffusion region 23, the passage of current from the N⁻ epitaxial layer 5 to the P diffusion region 23 can be ensured during reverse conduction of the semiconductor device 1G. This stabilizes the turning on of the parasitic thyristor. Since, in this preferred embodiment, the electrode 27 is provided on the N⁻ epitaxial layer 5 with the N⁺ diffusion region 29 in between, a good electrical connection can be ensured between the electrode 27 and the N⁻ epitaxial layer 5.

In this preferred embodiment, as in the aforementioned second preferred embodiment, the N diffusion region 35 having a higher carrier density than the N⁻ epitaxial layer 5 may be formed between the N⁻ epitaxial layer 5 (semiconductor layer) and the P diffusion region 23 to surround the P diffusion region 23.

Eighth Preferred Embodiment

Figure 11:
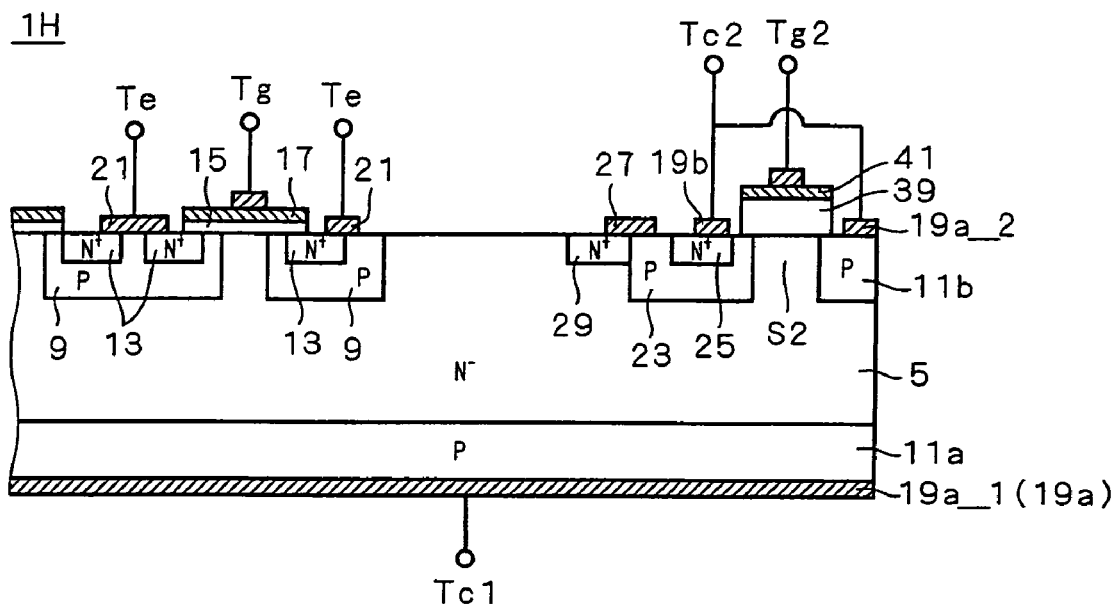
FIG. 11 is a cross-sectional view of a semiconductor device according to an eighth preferred embodiment.

A semiconductor device 1H according to this preferred embodiment is, as shown in FIG. 11, constructed such that the semiconductor device 1G according to the aforementioned seventh preferred embodiment (FIG. 10) further includes a P diffusion region 11b (sixth semiconductor region of the first conductivity type) formed in the surface of the N⁻ epitaxial layer 5 (semiconductor layer) apart from the P diffusion regions 9 and 23 (first and fourth semiconductor regions); a third collector electrode 19a_2 provided on the P diffusion region 11b and connected to the second collector electrode 19b; the second gate electrode 41 provided on a surface portion of the N⁻ epitaxial layer 5 which is sandwiched between the P diffusion regions 23 and 11b, with the second gate insulating film 39 in between; and the second gate terminal Tg2 connected to the second gate electrode 41. In this preferred embodiment, the components corresponding to those in the aforementioned first preferred embodiment are denoted by the same reference numerals and characters.

This semiconductor device 1H is, in other words, such that the aforementioned third preferred embodiment is applied to a lateral IGBT.

The P diffusion regions 11a and 11b both correspond to the P diffusion region 11 in the aforementioned third preferred embodiment; the first and second collector electrodes 19a_1 (19a) and 19a_2 both correspond to the collector electrode 19a in the third preferred embodiment; and the first and second collector terminals both correspond to the collector terminal Tc in the third preferred embodiment. This semiconductor device 1H does not include components which correspond to the P diffusion region 7 and the P⁺ substrate 3 in the third preferred embodiment. Considering these correspondences, the operation of the semiconductor device 1H is identical to that of the semiconductor device 1D of the third preferred embodiment, so the description thereof is omitted.

In the semiconductor device 1H of the above structure, as in the third preferred embodiment, the second gate electrode 41 is provided on the surface portion of the N⁻ epitaxial layer 5 which is sandwiched between the P diffusion regions 11b and 23, with the second gate insulating film 39 in between, that is, a P-channel MOSFET is provided whose drain and source are formed respectively of the P diffusion regions 11b and 23. Thus, by controlling continuity and non-continuity between the P diffusion regions 11b and 23 through the on-off control of that P-channel MOSFET, the semiconductor device 1H can selectively switch between two structures: the one substantially identical to the conventional structure of the collector-shorted IGBT (first conventional example); and the one substantially identical to that of the semiconductor device 1G according to the aforementioned seventh preferred embodiment. Therefore, in turn-on of the semiconductor device 1H, the above P-channel MOSFET is turned off so that the semiconductor device 1H can quickly be turned on just like the semiconductor device 1G, while in turn-off of the semiconductor device 1H, the above P-channel MOSFET is turned on so that the semiconductor device 1H can quickly be turned off just like the collector-shorted IGBT of conventional structure. This achieves a vertical collector-shorted IGBT which can turn both on and off quickly.

Ninth Preferred Embodiment

Figure 12:
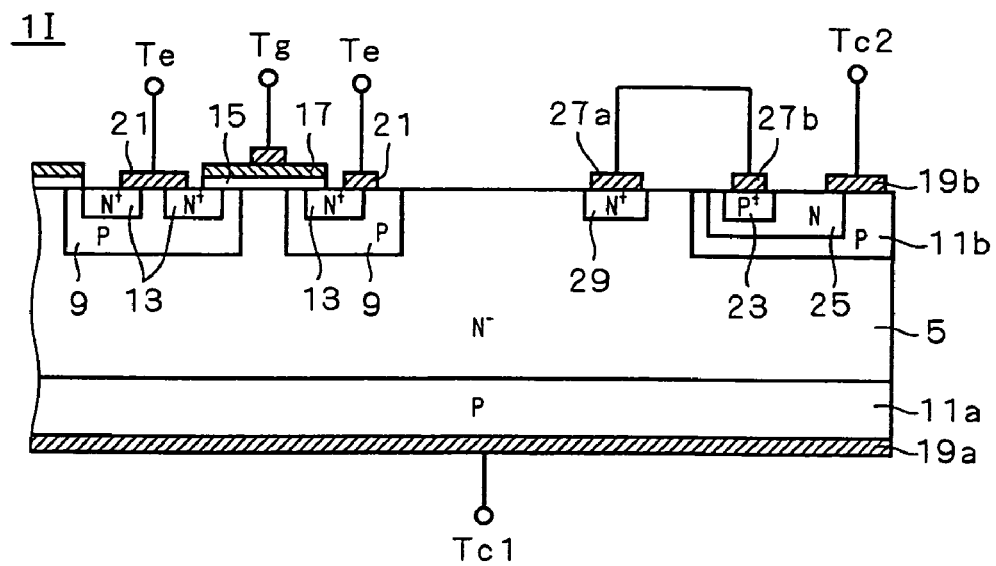
FIG. 12 is a cross-sectional view of a semiconductor device according to a ninth preferred embodiment.

A semiconductor device 1I according to this preferred embodiment includes, as shown in FIG. 12, the N⁻ epitaxial layer 5 (semiconductor layer of a second conductivity type); the P diffusion regions 9 (first semiconductor regions of a first conductivity type) formed in one main surface of the N⁻ epitaxial layer 5; the N⁺ diffusion regions 13 (second semiconductor regions of the second conductivity type) formed in the surfaces of the P diffusion regions 9 so as to be surrounded by the P diffusion regions 9; the gate electrode 17 provided on the surface portions of the P diffusion regions 9 which are sandwiched between the N⁻ epitaxial layer 5 and the N⁺ diffusion regions 13, with the gate insulating film 15 in between; the P diffusion region 11a (third semiconductor region of the first conductivity type) provided on the other main surface of the N⁻ epitaxial layer 5; the first collector electrode 19a provided on the surface of the P diffusion region 11a; and the emitter electrode 21 connected to the P diffusion regions 9 and the N⁺ diffusion regions 13. In addition to this fundamental structure, the semiconductor device 1I further includes the P diffusion region 11b (fourth semiconductor region of the first conductivity type) formed in the surface of the N⁻ epitaxial layer 5 apart from the P diffusion regions 9; the N diffusion region 25 (fifth semiconductor region of the second conductivity type) formed in the surface of the P diffusion region 11b so as to be surrounded by the P diffusion region 11b; the P+ diffusion region 23 (sixth semiconductor region of the first conductivity type) formed in the surface of the N diffusion region 25 so as to be surrounded by the N diffusion region 25; the second collector electrode 19b provided on and extending through the N diffusion region 25 and the P diffusion region 11b and applied with the same voltage as the first collector electrode 19a; and the electrodes 27a and 27b connected respectively to the N− epitaxial layer 5 and the P+ diffusion region 23 to form a conducting path from the N− epitaxial layer 5 to the P+ diffusion region 23.

The electrode 27a is provided on the N− epitaxial layer 5 with the N+ diffusion region 29 formed in the surface of the N− epitaxial layer 5 in between so as to form an ohmic contact with the N− epitaxial layer 5. The electrode 27b is provided on the P+ diffusion region 23 and electrically connected to the electrode 27a. The first gate electrode 17 is connected to the gate terminal Tg, the emitter electrode 21 to the emitter terminal Te, and the first and second collector electrodes 19a and 19b respectively to the first and second collector terminals Tc1 and Tc2.

In this preferred embodiment, the components corresponding to those in the aforementioned first preferred embodiment are denoted by the same reference numerals and characters.

This semiconductor device 1I is, in other words, such that the aforementioned sixth preferred embodiment is applied to a lateral IGBT.

The P diffusion regions 11a and 11b correspond to the P diffusion region 11 in the sixth preferred embodiment, and the first and second collector electrodes 19a and 19b correspond to the collector electrode 19 in the sixth preferred embodiment. The first and second collector terminals Tc1 and Tc2 correspond to the collector terminal Tc in the sixth preferred embodiment, and they are applied with the same voltage. This semiconductor device 1I does not include components which correspond to the P diffusion region 7 and the P+ substrate 3 in the sixth preferred embodiment. Considering these correspondences, the operation of the semiconductor device 1I is identical to that of the semiconductor device 1F of the sixth preferred embodiment, so the description thereof is omitted.

In the semiconductor device 1I of the above structure, as in the sixth preferred embodiment, the N diffusion region 25 is formed in the surface of the P diffusion region 11b so as to be surrounded by the P diffusion region 11b; the P+ diffusion region 23 is formed in the surface of the N diffusion region 25 so as to be surrounded by the N diffusion region 25; and the collector electrode 19b is provided on and extends through the components 11b and 25 so as to short circuit those components 11b and 25. Thus, the semiconductor device 1I can have the diode consisting of the components 23 and 25 for reverse conduction without inhibiting the turning on of the transistor consisting of the components 11b, 5, and 9 and the transistor consisting of the components 11a, 5, and 9.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate of a first conductivity type;
   a semiconductor layer of a second conductivity type formed on one main surface of said semiconductor substrate;
   a first semiconductor region of the first conductivity type formed in a surface of said semiconductor layer and connected to said semiconductor substrate through a semiconductor region of the first conductivity type;
   a second semiconductor region of the first conductivity type formed in the surface of said semiconductor layer apart from said first semiconductor region;
   a third semiconductor region of the second conductivity type formed in a surface of said first semiconductor region so as to be surrounded by said first semiconductor region;
   a first gate electrode provided on a surface portion of said first semiconductor region which is sandwiched between said third semiconductor region and said semiconductor layer, with a first gate insulating film in between said first gate electrode and said surface portion of said first semiconductor region;
   a first collector electrode provided on said second semiconductor region;
   an emitter electrode connected to said first and third semiconductor regions;
   a fourth semiconductor region of the first conductivity type formed in the surface of said semiconductor layer apart from said first and second semiconductor regions;
   a fifth semiconductor region of the second conductivity type formed in a surface of said fourth semiconductor region so as to be surrounded by said fourth semiconductor region;
   a second collector electrode provided on said fifth semiconductor region and connected to said first collector electrode; and
   a sixth semiconductor region of the second conductivity tyre formed in the surface of said semiconductor layer apart from said third and fifth semiconductor regions;
   a conducting electrode separated from said first and second collector electrodes, separated from said fifth semiconductor region, and connected to said fourth semiconductor region and said sixth semiconductor region to bridge both of said fourth semiconductor region and said sixth semiconductor region and form a conducting path from said semiconductor layer to said fourth semiconductor region.

2. The semiconductor device according to claim 1, further comprising
   a semiconductor region of the second conductivity type having a higher carrier density than said semiconductor layer and being formed between said semiconductor layer and said fourth semiconductor region to surround said fourth semiconductor region.

3. The semiconductor device according to claim 1, further comprising
   a second gate electrode provided on a surface portion of said fourth semiconductor region which is sandwiched between said semiconductor layer and said fifth semiconductor region, with a second gate insulating film in between said second gate electrode and said surface portion of said fourth semiconductor region.

4. The semiconductor device according to claim 1, further comprising
   a second gate electrode provided on and extending through surface portions of said semiconductor layer and said fourth semiconductor region which are sandwiched between said second and fifth semiconductor regions, with a second gate insulating film in between said second gate electrode and said surface portions of said semiconductor layer and said fourth semiconductor region.

5. The semiconductor device according to claim 1, wherein
said second collector electrode is a pad formed on said semiconductor layer for connection with a collector terminal, and
said fourth and fifth semiconductor regions are formed in an underlying layer of said pad.

6. The semiconductor device according to claim 1, wherein said first and second collector electrodes are connected to each other at a collector terminal.

7. The semiconductor device according to claim 1, wherein said second collector electrode is provided only on said fifth semiconductor region.

8. The semiconductor device according to claim 1, wherein said sixth semiconductor region comprises an ohmic contact region of the second conductivity type connecting said conducting electrode and said semiconductor layer.

9. The semiconductor device according to claim 1, wherein said fourth semiconductor region and said fifth semiconductor region form a diode preventing electrons injected from said emitter electrode into said semiconductor layer from flowing to said second collector electrode.

10. The semiconductor device according to claim 1, wherein said first semiconductor region, said semiconductor region connected to said first semiconductor region, said semiconductor layer, said semiconductor substrate, said fourth semiconductor region and said fifth semiconductor region form a parasitic thyristor on a reverse conducting path from said emitter electrode to said second collector electrode.

11. The semiconductor device according to claim 1, wherein
said first collector electrode is provided only on said second semiconductor region and is connected to said semiconductor layer with said second semiconductor region therebetween, and
said second collector electrode is provided only on said fifth semiconductor region and is connected to said semiconductor layer with said fifth semiconductor region and said fourth semiconductor region therebetween.

12. The semiconductor device according to claim 1, wherein said second collector electrode is provided on said fifth semiconductor region between said first collector electrode provided on said second semiconductor region and said conducting electrode connected to said fourth semiconductor region and said semiconductor layer.

13. The semiconductor device according to claim 1, wherein said second semiconductor region is formed in said semiconductor layer between said first semiconductor region and said fourth semiconductor region.

14. The semiconductor device according to claim 1, wherein said sixth semiconductor region is connected directly to said fourth semiconductor region.

15. The semiconductor device according to claim 1, wherein said first collector electrode is connected to said second collector electrode independent of said conducting electrode.

16. The semiconductor device according to claim 1, wherein said sixth semiconductor region comprises at least part of said conducting path from said semiconductor layer to said fourth semiconductor region.

17. The semiconductor device according to claim 1, further comprising
a second gate electrode provided on a surface portion of said semiconductor layer which is sandwiched between said second and fourth semiconductor regions, with a second gate insulating film in between said second gate electrode and said surface portion of said semiconductor layer.

18. The semiconductor device according to claim 17, wherein
said second gate insulating film is formed to approximately a thickness of a field oxide film.

19. The semiconductor device according to claim 1, wherein said fifth semiconductor region is formed entirely in the surface of said fourth semiconductor region so as to be surrounded by said fourth semiconductor region.

20. The semiconductor device according to claim 19, wherein said second collector electrode is provided only on said fifth semiconductor region.

21. A semiconductor device comprising:
a semiconductor layer of a second conductivity type;
a first semiconductor region of a first conductivity type formed in a first surface portion of said semiconductor layer;
a second semiconductor region of the first conductivity type formed in a second surface portion of said semiconductor layer apart from said first semiconductor region;
a third semiconductor region of the second conductivity type formed in a surface of said first semiconductor region so as to be surrounded by said first semiconductor region;
a first gate electrode provided on a surface portion of said first semiconductor region which is sandwiched between said third semiconductor region and said semiconductor layer, with a first gate insulating film in between said first gate electrode and said surface portion of said first semiconductor region;
a first collector electrode provided on said second semiconductor region a first emitter electrode connected to said first and third semiconductor regions;
a fourth semiconductor region of the first conductivity type formed in a third surface portion of said semiconductor layer apart from said first and second semiconductor regions;
a fifth semiconductor region of the second conductivity type formed in a surface of said fourth semiconductor region so as to be surrounded by said fourth semiconductor region;
a second collector electrode provided on said fifth semiconductor region;
a sixth semiconductor region of the second conductivity tyre formed in the surface of said semiconductor layer apart from said third and fifth semiconductor regions;
a conducting electrode separated from said first and second collector electrodes, separated from said fifth semiconductor region, and connected to said fourth semiconductor region and said sixth semiconductor region to bridge both of said fourth semiconductor region and said sixth semiconductor region and form a conducting path from said semiconductor layer to said fourth semiconductor region.

22. The semiconductor device according to claim 21, wherein
said second collector electrode is connected to said first collector electrode at a collector terminal.

23. The semiconductor device according to claim 21, wherein said sixth semiconductor region comprises an ohmic contact region of the second conductivity type connecting said conducting electrode and said semiconductor layer.

24. The semiconductor device according to claim 21, wherein said fourth semiconductor region and said fifth semiconductor region form a diode preventing electrons injected from said first emitter electrode into said semiconductor layer from flowing to said second collector electrode.

25. The semiconductor device according to claim 21, wherein said first semiconductor region, said semiconductor layer, said fourth semiconductor region and said fifth semiconductor region form a parasitic thyristor on a reverse conducting path from said first emitter electrode to said second collector electrode.

26. The semiconductor device according to claim 21, further comprising
a seventh semiconductor region of the second conductivity type having a higher carrier density than said semiconductor layer and being formed between said semiconductor layer and said fourth semiconductor region to surround said fourth semiconductor region.

27. The semiconductor device according to claim 21, further comprising
a second gate electrode provided on a surface portion of said fourth semiconductor region which is sandwiched between said semiconductor layer and said fifth semiconductor region, with a second gate insulating film in between said second gate electrode and said surface portion of said fourth semiconductor region.

28. The semiconductor device according to claim 21, further comprising
a second gate electrode provided on and extending through surface portions of said semiconductor layer and said fourth semiconductor region which are sandwiched between said second and fifth semiconductor regions, with a second gate insulating film in between said second gate electrode and said surface portions of said semiconductor layer and said fourth semiconductor region.

29. The semiconductor device according to claim 21, wherein
said second collector electrode is a pad formed on said semiconductor layer for connection with a collector terminal, and
said fourth and fifth semiconductor regions are formed in an underlying layer of said pad.

30. The semiconductor device according to claim 21, wherein
said second collector electrode has the same voltage applied thereto as said first collector electrode.

31. The semiconductor device according to claim 21, further comprising:
a seventh semiconductor region of the first conductivity type formed in a fourth surface portion of said semiconductor layer apart from said first and fourth semiconductor regions;
a third collector electrode provided on said seventh semiconductor region and connected to said second collector electrode; and
a second gate electrode provided on a fifth surface portion of said semiconductor layer which is sandwiched between said fourth and seventh semiconductor regions, with a second gate insulating film in between said second gate electrode and said fifth surface portion of said semiconductor layer.

32. The semiconductor device according to claim 21, wherein
said first collector electrode is provided only on said second semiconductor region and is connected to said semiconductor layer with said second semiconductor region therebetween, and
said second collector electrode is provided only on said fifth semiconductor region and is connected to said semiconductor layer with said fifth semiconductor region and said fourth semiconductor region therebetween.

33. The semiconductor device according to claim 21, wherein said second collector electrode is provided on said fifth semiconductor region between said first collector electrode provided on said second semiconductor region and said conducting electrode connected to said fourth semiconductor region and said semiconductor layer.

34. The semiconductor device according to claim 21, wherein said second semiconductor region is formed in said semiconductor layer between said first semiconductor region and said fourth semiconductor region.

35. The semiconductor device according to claim 21, wherein said sixth semiconductor region is connected directly to said fourth semiconductor region.

36. The semiconductor device according to claim 21, wherein said first collector electrode is connected to said second collector electrode independent of said conducting electrode.

37. The semiconductor device according to claim 21, wherein said sixth semiconductor region comprises at least part of said conducting path from said semiconductor layer to said fourth semiconductor region.

38. The semiconductor device according to claim 21, further comprising a semiconductor substrate of the first conductivity type on which said semiconductor layer is formed.

39. The semiconductor device according to claim 38, further comprising a seventh semiconductor region of the first conductivity type for connecting said first semiconductor region and said semiconductor substrate.

40. The semiconductor device according to claim 21, further comprising
a second gate electrode provided on a fourth surface portion of said semiconductor layer which is sandwiched between said second and fourth semiconductor regions, with a second gate insulating film in between said second gate electrode and said fourth surface portion of said semiconductor layer.

41. The semiconductor device according to claim 40, wherein
said second gate insulating film is formed to approximately a thickness of a field oxide film.

42. The semiconductor device according to claim 21, wherein said fifth semiconductor region is formed entirely in the surface of said fourth semiconductor region so as to be surrounded by said fourth semiconductor region.

43. The semiconductor device according to claim 42, wherein said second collector electrode is provided only on said fifth semiconductor region.

* * * * *